United States Patent [19]

Aftergut et al.

[11] Patent Number: 5,091,466
[45] Date of Patent: Feb. 25, 1992

[54] INSOLUBILIZATION OF SOLUBLE PRE-IMIDIZED POLYIMIDES BY POLYHYDRAZINE COMPOUNDS

[75] Inventors: Siegfried Aftergut, Schenectady; Theresa A. Sitnik, Scotia, both of N.Y.

[73] Assignee: General Electric Company, Schenectady, N.Y.

[21] Appl. No.: 513,393

[22] Filed: Apr. 23, 1990

[51] Int. Cl.$^5$ .................. C08J 61/22; C08L 67/00; C08L 73/00
[52] U.S. Cl. .................. 524/600; 427/96; 428/35.7; 428/473.5; 524/190; 525/436
[58] Field of Search .............. 524/190, 600; 525/436; 428/35.7, 473.5; 427/96

[56] References Cited

U.S. PATENT DOCUMENTS

| | | | |
|---|---|---|---|
| 3,436,372 | 4/1969 | Hoegger | 525/436 |
| 3,666,709 | 5/1972 | Suzuki et al. | 528/188 |
| 3,847,867 | 11/1974 | Heath et al. | 528/125 |
| 4,485,140 | 11/1984 | Gannett et al. | 528/183 |
| 4,656,238 | 4/1987 | Kunimune et al. | 525/436 |

*Primary Examiner*—John Kight, III.
*Assistant Examiner*—T. Mosley
*Attorney, Agent, or Firm*—William H. Pittman; James C. Davis, Jr.

[57] ABSTRACT

A polyhydrazine is used to insolubilize a soluble polyimide. Soluble polyimide films on printed circuit boards can be insolubilized in this manner.

14 Claims, No Drawings

INSOLUBILIZATION OF SOLUBLE PRE-IMIDIZED POLYIMIDES BY POLYHYDRAZINE COMPOUNDS

The present invention relates to forming a shaped insoluble article from a solution of a pre-imidized polyimide and a polyhydrazine.

Polyimide materials in the form of films or other structures are widely used in electronic and other applications for their superior mechanical and dielectric properties and chemical stability at high temperatures. Appropriate structures, e.g. films, can be prepared by two general methods. Method A, the older of the two, utilizes a solution of a polyamic acid which, after application to a substrate, is heated to evaporate the solvent and to convert the polyamic acid to an insoluble imide polymer. Method B involves the use of a fully imidized (so-called preimidized) polymer which is soluble in a number of solvents. Application of the solution to the substrate and evaporation of the solvent yields the solid polymer.

Preimidized materials have certain advantages: their solutions have long term storage stability, the final polymer is obtained by simply evaporating the solvent, and no volatile materials are released when the polyimide is baked after solvent removal. One disadvantage is that the polyimide is still soluble after the film or structure has been formed. In some instances it is possible to insolubilize the polymer by heating it at relatively high temperatures, typically 300° to 400° C. At such temperatures the polymers become insolubilized. For example, U.S. Pat. No. 4,877,653 discloses heating polyimide articles formed from polyimide solution to a temperature of at least 325° C. to insolubilize the article. The preferred temperature for the insolubilization is from 350° C. to 400° C. In some applications, however, 400° C., and often even 300° C. is high enough to degrade or even destroy the device or other substrate to which the polyimide is being applied. For example, some solders used in assembling transistors or devices on a printed circuit board melt as low as about 270° C. The standard, advertised curing cycles thus are too high in temperature to permit the use of polyimides in many applications.

Solvent soluble polyimides are well known in the art. Examples of soluble polyimides and methods of manufacture are disclosed in U.S. Pat. Nos. 3,666,709; 3,817,927; 3,847,867; 4,111,906; 4,558,110; 4,588,804; 4,586,997; 4,620,497; 4,701,511; and 4,820,781 and many other patent and literature references. The above patents also disclose large numbers of solvents for the soluble polyimides. The listing of patents relating to soluble polyimides is neither representative or inclusive of the soluble polyimide art.

The amount of solvent used to dissolve soluble polyimides is not critical. If a thin film of polyimide is desired a very dilute solution is used. Generally a range of 100 parts to 5,000 parts by weight of solvent can be used per 100 parts by weight of polyimide.

Dissolution or etching of insoluble polyimides, such as duPont's KAPTON (a trade mark of duPont), by hydrazine is well known. In the mechanism proposed by J. I. Jones, in the Journal of Polymer Science, Part C, Volume 22 at page 773 (1969), hydrazine attacks the imide ring to yield a cyclic dihydrazide and the original diamine used in the synthesis of the polyimide. Thus in the case of KAPTON H shown in Formula I, treatment with hydrazine yields pyromellitic dihydrazide (II) and 4,4'-diamino-diphenyl ether (III).

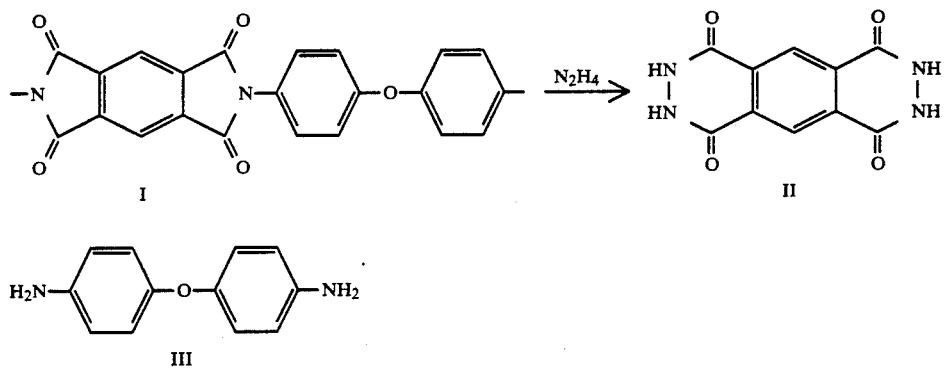

The present invention is based upon the discovery that a soluble polyimide is rendered insoluble by treatment of the soluble polyimide with a polyhydrazine.

Without being bound by theory, it was theorized that a compound such as 4,4'-methylenebis(phenylhydrazine), shown in Formula IV would result in crosslinking of polyimides. The insolubilization of initially soluble polyimides was envisioned to proceed according to the following scheme where Formula V represents a generic polyimide and two such chains are involved in the reaction with methylenebis(phenylhydrazine).

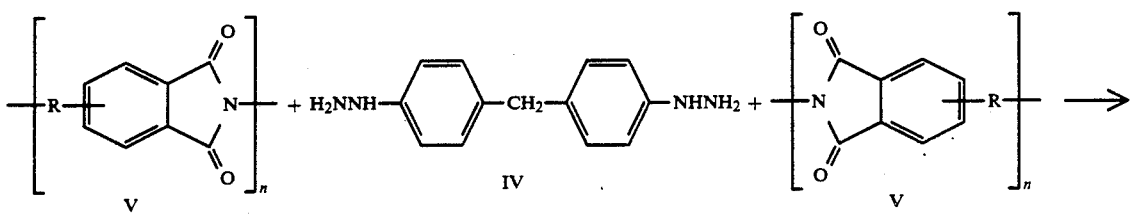

-continued

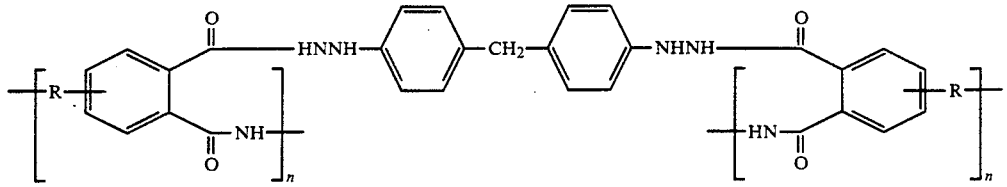

Whereas crosslinking by the scheme shown above is a possible mechanism, other mechanisms leading to insolubilization are also conceivable.

The method for insolubilizing a solvent soluble polyimide comprises:
(a) adding to a solution of the polyimide a sufficient amount to insolubilize the polyimide of a polyhydrazine which polyhydrazine is soluble in the polyimide solution;
(b) forming said polyimide in solution into a shaped article;
(c) subjecting said polyimide in solution to an elevated temperature of less than 250° for a period of time sufficient to evaporate the solvent and to insolubilize said polyimide composition.

Preferably the shaped article is a film, usually formed as a coating on a substrate such as a circuit board.

The method preferably involves subjecting the solution containing the polyimide and the polyhydrazine to a stepwise or gradual temperature increase in order that solvent be slowly evaporated and not trapped and form bubbles in the shaped article.

The method of forming the shaped article includes forming a solution of 100 parts by weight of the solvent soluble polyimide and 0.1 to 10 parts by weight of a polyhydrazine in an organic solvent, applying the solution to a substrate, and heating the solution to a temperature of less than 250° C. to insolubilize the polyimide and evaporate the organic solvent.

It is not necessary to heat the solution to 250° C. to evaporate the solvent and to insolubilize the shaped article. Both the insolubilization and the solvent evaporation can be easily performed at a temperature of at most about 200° C.

The method of the present invention is applicable to any soluble polyimide including polyimide copolymers. The action of the polyhydrazine compound on materials containing cyclic imide groups is a general one. Thus such types of soluble polyimides as amide-imide copolymers and silicone-imide copolymers behave in a similar fashion.

Most of the known soluble preimidized polyimides can be described by a general formula of a repeating unit which contains two cyclic imide rings. For example see the definition of polyimides in U.S. Pat. No. 4,485,140. There polyimides are defined as condensation type polymers having a repeating unit of the type:

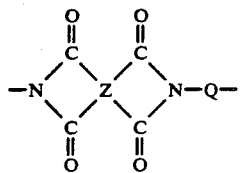

where Z is a suitable tetravalent organic radical, which may be a simple structure such as that derived from the benzene ring or a more complex structure such as that derived from benzophenone, or any other appropriate, usually aromatic, tetravalent organic radical; and Q is a divalent organic radical. Further detail is disclosed in U.S. Pat. No. 4,485,140 which is hereby incorporated by reference.

There are some polymers which can be represented by a repeating unit which contains only one cyclic imide ring. An example of such a repeating unit is the following,

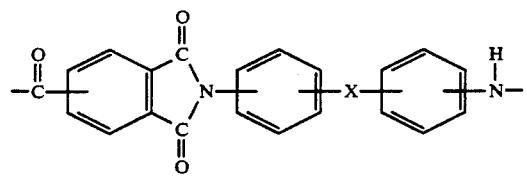

where X is O, S, or $(CH_2)_m$, and m has a value of from 0 to 6. The bonds to the aromatic rings are preferably in the para position, except for the carbonyl group which can be in the 3- or 4-position. The benzene rings can be substituted with alkyl or halogen.

In addition, a large number of solvent soluble aromatic polyimides are disclosed in U.S. Pat. No. 3,666,709. Solvents disclosed by the patent include a large number of phenolic solvents including phenolic solvents mixed with aromatic non solvents. Also disclosed are a large number of aprotic organic polar solvents.

U.S. Pat. No. 3,847,867, which patent is hereby incorporated by reference, discloses polyetherimides made by reacting an aromatic bis(ether anhydride) and an organic diamine in the presence of an organic solvent at temperatures of at least 130° C. Such polyetherimides consist essentially of the following chemically combined units of the formula,

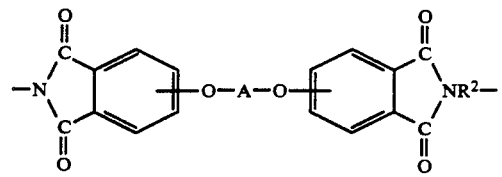

where A is a divalent aryl radical including bis aryl radicals and can be substituted with methyl and bromine radicals. The two aryl radicals of the bis aryl radical can be joined by a covalent bond or by one or more divalent radicals of the formulas, their solubility characteristics. The polyimides can be illustrated by the idealized formula:

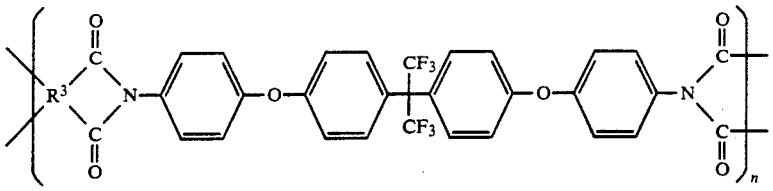

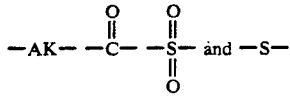

The divalent bonds of the —O—A—O— radical are equally situated on the phthalimide end groups, e.g., in the 3,3' positions or the 4,4' positions. AK is an alkylene radical having from 1 to 5 carbon atoms. $R^2$ is a divalent organic radical selected from the class consisting of (a) aromatic hydrocarbon radicals having from 6–20 carbon atoms and halogenated derivatives thereof, (b) alkylene radicals and cycloalkylene radicals having from 2–20 carbon atoms, (c) $C_{(2-8)}$ alklylene terminated polydiorganosiloxane, and (d) divalent radicals included by the formula,

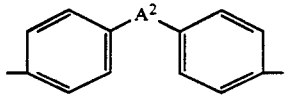

where $A^2$ is a member selected from the class consisting of

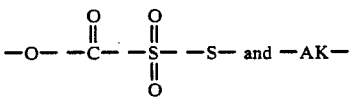

where AK is an alkylene radical having from 1 to 5 carbon atoms.

Such polyimides are soluble in organic solvents such as methylene chloride, chloroform, N,N-dimethylacetamide, etc.

U.S. Pat. No. 3,905,942 also discloses a corresponding high temperature method for making soluble polyimides from the corresponding tetra-carboxylic acids. Solvents for these polyimides include methylene chloride, chloroform, N,N-dimethylformamide, N,N-dimethylacetamide, meta-cresol, etc.

U.S. Pat. No. 3,818,927 discloses soluble polyimides prepared by condensing a tetracarboxylic acid of the formula:

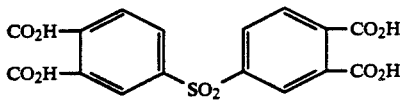

or a derivative thereof which forms amido groups with 4,4'-diaminobenzophenone in a polar organic solvent at a temperature above 160° C. The polyimide is soluble in polar organic solvents such as N-methylpyrrolidone.

U.S. Pat. No. 4,111,906 discloses polyimides prepared from perfluoroisopropylidene diamine which maintain their solubility characteristics. The polyimides can be illustrated by the idealized formula:

wherein n is an integer sufficient to provide a structure having an average molecular weight of at least 5000 and $R^3$ is an organic radical of 5 to 22 atoms which may be an aliphatic radical, including alicyclic, or an organic radical having one or more benzene rings or fused polynuclear rings.

Another class of solvent soluble polyimides which exemplify the much broader class of solvent soluble polyimides which can be employed in the practice of the present invention are the polyetherimide-silicone copolymers and the polyetherimide-silicone copolymer blends. These materials are disclosed for example in U.S. Pat. Nos. 4,558,110; 4,586,997; and 4,670,497, the disclosures of which are hereby incorporated by reference. The copolymers are soluble in a broad range of organic solvents including solvents derived from monoalkyl and/or dialkyl ethers of ethylene glycol and condensed polyethylene glycols and/or cyclic ethers containing no less than a five member ring, such a as diglyme (i.e., diethylene glycol dimethyl ether).

Silicone copolymer-polyetherimide blends are examples of the above described class. They are disclosed in U.S. Pat. No. 4,820,781. Such blends comprise by weight, (A) about 1–99% of polyetherimide, and
(B) about 99–1% of silicone copolymer comprising from about 10 to 70 mole percent, and preferably from 25 to 50 mole percent of disiloxane units of the formula,

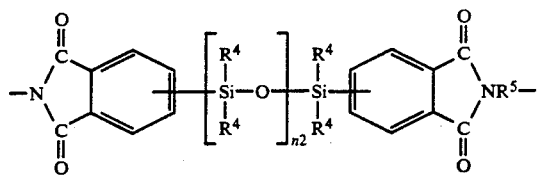

intercondensed with from about 90 to 30 mole percent and preferably from 75 to 50 mole percent of etherimide units of the formula,

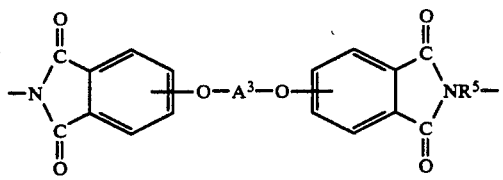

where $R^4$ is a member selected from the class consisting of the same or different $C_{(1-14)}$ monovalent hydrocarbon radicals and $C_{(1-14)}$ hydrocarbon radicals substituted with radicals inert during intercondensation, $R^5$ is a member selected from the class consisting of divalent $C_{(2-20)}$ organic radicals and halogenated derivatives thereof, $A^3$ is a divalent $C_{(6-30)}$ aromatic radical, and n2 is an integer having a value of 1 to 5 inclusive. Further detail concerning the radicals is found in U.S. Pat. No. 4,820,781 and the patents referenced therein.

Other patents disclosing examples of organic solvent soluble polyimides which can be insolubilized by the practice of the present invention include U.S. Pat. Nos. 4,588,804 and 4,701,511.

The examples of soluble polyimides above are not intended to limit the scope of the present invention which is applicable to any polyimide which is soluble in any organic solvent.

The solvent used in the process of the present invention can be any solvent which is a solvent for both the polyimide and the polyhydrazine.

Examples of solvents which can be used in the practice of the present invention are listed in detail in the above reference patents and include for example:
methylene chloride,
chloroform,
N,N-dimethylformamide,
N,N-dimethylacetamide,
meta-cresol,
gamma-butyrolactone,
butyl acetate,
N-methylpyrrolidone, and
mixtures thereof.

The polyhydrazine which can be used in the practice of the present invention has two or more hydrazine groups and has the generic formula:

$$R^7(NHNH_2)_x$$

where $R^7$ is an organic radical and x has a value of two or three or more. x preferably has a value of two resulting in a bishydrazine of the formula $$H_2NNH-R^8-NHNH_2$$

where $R^8$ is a divalent organic radical. The hydrazines are known in the art and will not be described in detail. Among the polyhydrazines that can be employed are those having the generic formula:

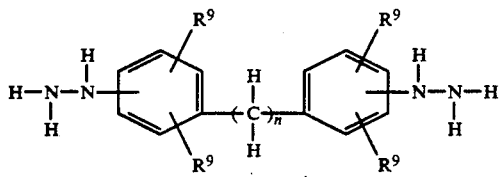

Radicals which are included within $R^9$ are for example hydrogen, chloride, fluoride, nitro, hydrazyl, alkyl, phenyl, alkylphenyl, alkoxy and sulfonic acid; and n has a value of from 0 to six inclusive. When n has a value of 0 the two aromatic rings in the above formula are joined by a covalent bond. Preferably $R^9$ is hydrogen and n is 1.

Examples of compounds represented by the general formula are:
4,4'-dihydrazinobiphenyl,
4,4'-dihydrazino-2,2'-dimethylbiphenyl,
4,4'-dihydrazino-2,2'-dichlorobiphenyl,
4,4'-dihydrazino-2,2'-dinitrobiphenyl,
4,4'-dihydrazino-2,2'-biphenyldisulfonic acid,
4,4'-dihydrazino-2-phenylbiphenyl,
4,4'-dihydrazino-2-p-tolylbiphenyl,
4,4'-dihydrazino-2,2'-dimethoxybiphenyl,
4,4'-dihydrazino-2-methoxybiphenyl,
4,4'-dihydrazino-2-ethoxybiphenyl,
methylenebis(4,4'-(3-chlorophenylhydrazine)),
1,2-ethylenebis(phenylhydrazine),
1,4-butylenebis(phenylhydrazine),
4-hydrazinophenyl-4'-(1,3-dihydrazinophenyl)methane, and
4,4',4''-tris(hydrazinophenyl)methane.

Another example of an available hydrazine which can be used, is 4,4'-dihydrazinooctafluorobiphenyl.

The polyhydrazine used in the following examples was 4,4'-methylenebis(phenylhydrazine) and was prepared as follows. Twenty-five grams of 4,4'-methylenebis(phenylhydrazine) hydrochloride hydrate was dissolved in about 500 ml of hot 1% hydrochloric acid, and the hot solution was filtered. The filtrate was treated dropwise with concentrated ammonium hydroxide solution until it was slightly basic to precipitate the free base. The white powder was collected, washed with two 50 ml portions of water, and recrystallized from ethyl alcohol to yield 16.4 grams (81% recovery) of 4,4'-methylenebis(phenylhydrazine). The free base was stored in a nitrogen-purged box because it tends to darken in air. The hydrochloride is unaffected by air.

A sufficient amount to insolubilize the polyimide is all the polyhydrazine that is required. This generally falls within the range of from 0.01 to ten parts by weight of the polyhydrazine for every 100 parts by weight of polyimide resin. Preferably the range is from 0.1 to one part by weight of the polyhydrazine for every 100 parts by weight of the polyimide resin.

The soluble polyimide preferably contains units of the formula

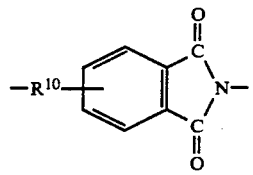

where $R^{10}$ is an organic, including a polysiloxane, containing radical. Other polyimides can also be used as the insolubilization is a result of the reaction between the imide groups on the polyimide and the hydrazine groups on the polyhydrazine.

The examples below are provided to illustrate embodiments of this invention and are not intended to limit this invention. All parts and percentages are by weight unless otherwise specified.

EXAMPLE I

PROBIMIDE 286 (a trademark of Ciba-Geigy) polyimide is a 10% solution of polymer in gamma-butyrolactone also containing a small amount of possibly xylene. The polyimide has the structure shown below derived from the reaction of 5(6)-amino-1-(4'-aminophenyl)-1,3,3-trimethylindane and benzophenonetetracarboxylic acid dianhydride,

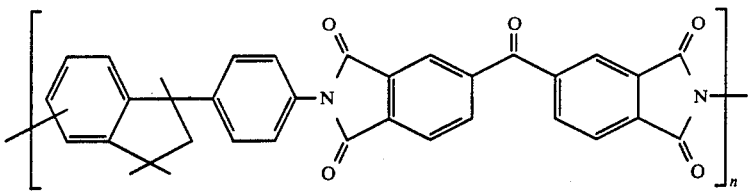

where n represents the number of monomeric units in the polymer.

PROBIMIDE 286 was diluted with gamma-butyrolactone to a solids content of 5%. About 3 drops of trifluoroacetic acid was added to 50 grams of the 5% solution, and to 10 grams of this solution was added 0.05 grams of 4,4'-methylenebis(phenylhydrazine)(MBPH). The mixture was coated on a glass slide which had been previously treated with a silane coupling agent. The resulting film was baked for one-half hour at 150° C., followed by one-half hour at 200° C. The coating, about 0.14 micrometers thick, was insoluble in gamma-butyrolactone(GBL). By contrast, a film cast from a solution identical to the above except that it did not contain MBPH, and baked under identical conditions, dissolved within a few seconds. Upon standing at room temperature, the acid catalyzed MBPH mixture gelled within a few hours whereas the mixture without acid failed to gel within ten days. The time required for gelation depends on the concentration of the polymer and MBPH.

EXAMPLE II

XU218HP (a trademark of Ciba-Geigy) is a solid polyimide reportedly identical to that contained in PROBIMIDE 286. However, PROBIMIDE 286 as supplied by Ciba-Geigy and XU218HP dissolved in gamma-butyrolactone behaved somewhat differently with respect to methylenebis(phenylhydrazine). The commercial solution required the addition of a trace of acid (trifluoroacetic acid was used) for insolubilization by methylenebis(phenylhydrazine) whereas solutions prepared from solid XU218HP in various solvents, such as gamma-butyrolactone, N-methylpyrrolidone, N,N-dimethylacetamide and chloroform, showed insolubilization by methylenebis(phenylhydrazine) without addition of acid. Evidence for insolubilization was derived either by making thin films and testing for solubility in the solvent from which the films were cast or by observing the precipitation of a gel when the methylenebis(phenylhydrazine) treated solution was allowed to stand for some time. Solutions containing 10% of XU218HP in gamma-butyrolactone, N-methylpyrrolidone, or N,N-dimethylacetamide started to gel within one-half to a few hours after addition of methylenebis(phenylhydrazine) without acid catalysis.

EXAMPLE III

SIX-EFF 44 (a trademark of Hoechst-Celanese) polyimide is soluble in several organic solvents such as butyl acetate and gamma-butyrolactone. The polyimide has the structure shown in the formula,

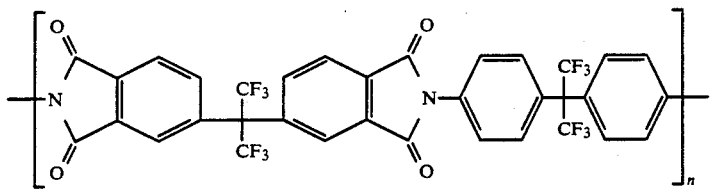

where n represents the number of monomeric units in the polyimide.

A mixture prepared from 5 parts SIX-EFF-44, 0.25 parts methylenebis(phenylhydrazine) and 95 parts gamma-butyrolactone was spin coated on glass substrates and baked for ½ hour at 150° C., followed by ½ hour at 200° C. These films were substantially insoluble in hot gamma-butyrolactone whereas films of SIX-EFF 44 made without methylenebis(phenylhydrazine) dissolved within a few seconds in cold gamma-butyrolactone. The liquid mixture containing methylenebis(phenylhydrazine) gelled within a few hours upon standing at room temperature.

EXAMPLE IV

PYRALIN LTP-PI 2590 (a trademark of duPont) fully imidized polyimide is supplied in N-methylpyrrolidone (NMP) solution. The solution contains 21-23% by weight of the polyimide. The solution was diluted with an equal weight of NMP, and an amount of methylenebis(phenylhydrazine) equal to 4% by weight of the polyimide was added. Films were spin coated on glass substrates, and the films were baked for ½ hour at 150° C., followed by ½ hour at 200° C. These films were only sparingly soluble in NMP, whereas corresponding films without methylenebis(phenylhydrazine) were readily soluble. The liquid methylenebis(phenylhydrazine) containing mixture gelled after standing for some time at room temperature.

EXAMPLE V

ULTEM 1000 (a trademark of The General Electric Company) polyetherimide is organic solvent soluble. A solution containing 10% by weight of ULTEM 1000 in N-methylpyrrolidone (NMP) was treated with a quantity of methylenebis(phenylhydrazine) corresponding to 10% of the weight of ULTEM. The viscosity of the solution increased gradually upon standing at room temperature and after standing for about four days at room temperature, the solution had turned into a gel. The gel was insoluble in the usual solvents for ULTEM.

EXAMPLE VI

SPI 129 (a trademark of The General Electric Company) is a solution of a copolymer comprising silicone and imide moieties. Ten grams of SPI 129 (containing 29% of solids) was treated with 0.06 grams of methylenebis(phenylhydrazine), and thin films were cast by spinning. The films were baked for ½ hour at 80° C., ½ hour at 145° C. and ½ hour at 200° C. These films showed some attack when treated with chloroform or 2-methoxyethyl ether but did not dissolve readily as did films cast from pure SPI 129. The initial methylenebis(phenylhydrazine)-SPI 129 solution gradually turned into a gel on standing.

SUPPORTING EVIDENCE

Tests were also carried out to confirm that methylenebis(phenylhydrazine) does not react with gamma-butyrolactone to give an insoluble polymer in the presence or absence of trifluoroacetic acid. No increase of viscosity or other evidence of reaction was noted in solutions that had been standing at room temperature for several months.

What is claimed is:

1. A composition comprising;
   100 parts by weight of an organic solvent soluble fully imidized polyetherimide;
   a sufficient amount of an organic solvent to dissolve the polyimide; and
   a sufficient amount of a polyhydrazine to insolubilize the polyetherimide upon heating to an elevated temperature less than 250° C.;
   said polyetherimide consisting essentially of structural units of the formula

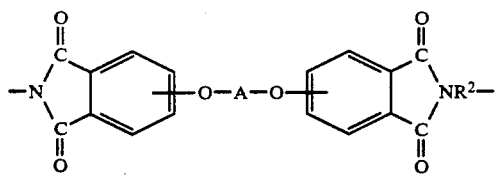

wherein:
   A is a bisaryl radical in which the two aryl groups are joined by a covalent bond or by one or more divalent radicals selected from the class consisting of

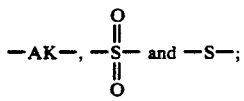

AK is an alkylene radical having from 1 to 5 carbon atoms; and
   $R^2$ is a divalent organic radical selected from the class consisting of (a) aromatic hydrocarbon radicals having from 6-20 carbon atoms and halogenated derivatives thereof, (b) alkylene radicals and cycloalkylene radicals having from 2-20 carbon atoms, (c) $C_{(2-8)}$ alkylene-terminated polydiorganosiloxane and (d) divalent radicals includes by the formula

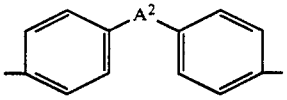

where $A^2$ is selected from the class consisting of

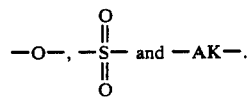

2. A composition according to claim 1 wherein the polyimide consists essentially of units of the formula

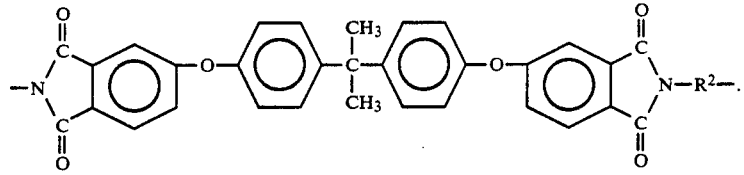

3. A method for insolubilizing a solvent soluble fully imidized polyetherimide consisting essentially of structural units of the formula

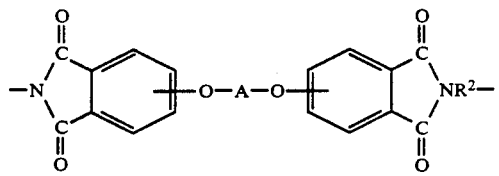

wherein:
   A is a bisaryl radical in which the two aryl groups are joined by a covalent bond or by one or more divalent radicals of the formulas

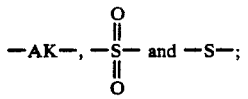

AK is an alkylene radical having from 1 to 5 car on atoms; and
   $R^2$ is a divalent organic radical selected from the class consisting of (a) aromatic hydrocarbon radicals having from 6-20 carbon atoms and halogenated derivatives thereof, (b) alkylene radicals and cycloalkylene radials having from 2-20 carbon atoms, (c) $C_{(2-8)}$ alkylene-terminated polydiorganosiloxane and (d) divalent radicals included by the formula

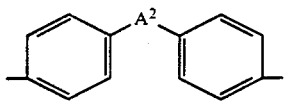

where $A^2$ is selected from the class consisting of

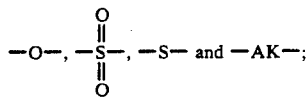

comprising
(a) adding to a solution of the polyetherimide a sufficient amount to insolubilize the polyetherimide of a polyhydrazine which is soluble in the polyetherimide solution;
(b) forming said polyetherimide in solution into a shaped article;
(c) subjecting said polyetherimide in solution to an elevated temperature of less than 250° C. for a period of time sufficient to evaporate the solvent and to insolubilize said polyetherimide.

4. A method according to claim 3 wherein the polyimide consists essentially of units of the formula

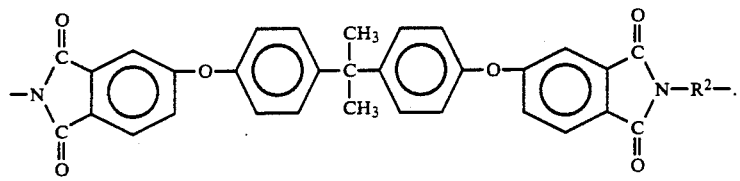

5. The composition of claim 1 wherein the hydrazine has the formula

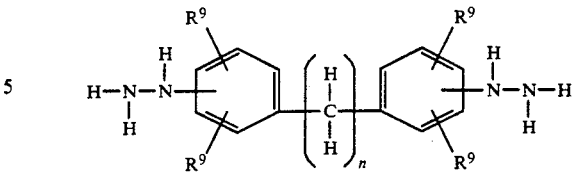

wherein each $R^9$ is independently selected from the group consisting of hydrogen, chloride, fluoride, nitro, hydrazyl, alkyl, phenyl, alkylphenyl, alkoxy and sulfonic acid radicals and n has a value of from 0 to 6.

6. The composition of claim 1 wherein the polyhydrazine is present at a level of 0.1 to 10 parts by weight per 100 parts of polyimide polyetherimide.

7. The composition of claim 1 wherein the amount of solvent is from 100 parts to 5,000 parts per 100 parts of polyetherimide.

8. The method of claim 3 wherein the shaped article is a film.

9. The method of claim 3 wherein subjecting said composition to an elevated temperature involves a stepwise or gradual temperature increase.

10. The method of claim 3 wherein the shaped article is formed by (a) applying the solution to a substrate, and
(b) evaporating the organic solvent.

11. The method of claim 3 wherein the polyetherimide insolubilization is performed at a temperature of at most 200° C.

12. The method of claim 3 wherein the solvent is an organic solvent.

13. The method of claim 3 wherein the polyhydrazine has the formula $$H_2NNH-R^8-NHNH_2$$

where $R^8$ is an organic radical.

14. The method of claim 3 wherein the polyhydrazine is present at a level of 0.1 to 10 parts by weight per hundred parts of polyetherimide.

* * * * *